United States Patent [19]

Faubel et al.

[11] 4,272,699

[45] Jun. 9, 1981

[54] ELECTRON IMPACT ION SOURCE WITH FIELD EMISSION CATHODE

[75] Inventors: Manfred Faubel, Rosdorf, Fed. Rep. of Germany; William M. Holber, Chicago, Ill.; Jan P. Toennies, Göttingen, Fed. Rep. of Germany

[73] Assignee: Max-Planck-Gesellschaft zur Forderung der Wissenschaften e.V, Fed. Rep. of Germany

[21] Appl. No.: 18,646

[22] Filed: Mar. 8, 1979

[30] Foreign Application Priority Data

Mar. 13, 1978 [DE] Fed. Rep. of Germany ....... 2810736

[51] Int. Cl.[3] ...................... H01J 37/073; H01J 37/08; H01J 49/14; H01J 19/24

[52] U.S. Cl. .................................... 313/360; 250/427; 313/309; 313/336; 313/363

[58] Field of Search ............... 313/336, 230, 360, 309, 313/351, 363; 250/427

[56] References Cited

U.S. PATENT DOCUMENTS

| | | | |
|---|---|---|---|
| 220,248 | 10/1879 | Manning | 313/351 |
| 3,274,436 | 9/1966 | Reich | 313/230 X |
| 3,883,760 | 5/1975 | Cunningham, Jr. | 313/336 X |
| 3,913,520 | 10/1975 | Berg et al. | 313/309 X |

*Primary Examiner*—Palmer C. Demeo

*Attorney, Agent, or Firm*—Kinzer, Plyer, Dorn & McEachran

[57] ABSTRACT

A field emission cathode affording multiple emitting points, formed by a multiplicity of carbon fibers mounted on a conductive base, preferably in spaced clusters of about one thousand or more fibers, and projecting from the base to afford a multiplicity of emission points at the fiber tips. The fibers are in a range of diameters of about two to ten microns. As applied to an electron impact ion source for an instrument such as a mass spectrometer or molecular beam detector, the cathode is of annular configuration, incorporated in an electrode assembly comprising, radially inwardly of the assembly, the cathode, an extraction grid, a retardation grid and an ionization cage.

3 Claims, 8 Drawing Figures

ELECTRON IMPACT ION SOURCE WITH FIELD EMISSION CATHODE

BACKGROUND OF THE INVENTION

The present invention relates to a field emission cathode having a multiplicity of emitting tips. The invention moreover relates to a method for the fabrication of a field emission cathode and to the application of a field emission cathode.

Field emission cathodes have by their very nature certain advantages over thermal cathodes. Field emission cathodes develop less heat than thermal cathodes, a fact which is of considerable advantage particularly in instruments which are operated at low temperatures or which are intended to operate in a vacuum generated by a cryogenic pump. Moreover, field emission cathodes can be baked out more easily, as a rule, and the carbon fiber cathodes described herein are less sensistive to poor vacuum conditions than thermal cathodes.

It is known from the prior art to use a single graphite fiber as a field emission cathode (J.Phys.D: Appl. Phys., Vol. 7, 1974, pages 2105-2115). However, a field emission cathode consisting of a single graphite fiber is unable to furnish high emission currents. In addition, it is unduly sensitive and relatively unstable.

Moreover, it has been known for a long time already to use thin, pointed wires made from metals with high melting points, such as tungsten and molybdenum, as field emission cathodes. Field emission cathodes are known, for example from J.Appl.Phys. 41, 1970, page 7681, having a multiplicity of emitting tips in order to generate a higher emission current. A multiple tip cathode known according to prior art contains forty tungsten wires which form a spot-welded, comb-like structure. Another field emission cathode discussed in this publication primarily comprises a multiplicity of fine parallel tungsten needles and is produced by oriented cooling of a nickel-tungsten alloy, etching off of the nickel matrix for exposure of the parallel tungsten needles formed during solidification, and electrolytical shaping of the needles to afford pointed tips. The reciprocal distance of the tips is relatively large on the average compared with the thickness of the tungsten needles forming the tips, and that way relatively high field emission currents can be generated, of the order of one milliampere. However, these tungsten needle cathodes are extremely sensitive to overloads and ion impact, which at relatively high vacuums may lead to permanent damage and changes of the emission capacity.

SUMMARY OF THE INVENTION

Starting from this state of the art, the present invention is based on the problem of devising a field emission cathode which is capable of furnishing high emission currents, is rugged as well as insensitive, and which can be produced at low cost.

According to the invention, this problem is solved by a field emission cathode having a cluster of carbon fibers whose ends form the emitting tips.

The surprising discovery was made that an excellent field emission cathode which is able to deliver high emission currents and which is rugged and insensitive, both mechanically and electrically, can be manufactured by fastening a carbon fiber cluster which is commercially available in the trade to an appropriate conductive support and severing it mechanically, for example by cutting it off. Although the cluster consists of carbon fibers placed very closely together and the carbon fibers are not shaped to points especially by a particular refinishing operation, such a field emission cathode will deliver high and stable emission currents at moderate field strengths. Another important advantage of the field emission cathode according to the invention is characterized by the fact that the emission properties are very stable and are not changed substantially by poor vacuum nor by other unfavorable influences.

A field emission cathode according to the invention can be produced simply by fastening a cluster of carbon fibers that is commercially available to a conductive support and by then mechanically severing the cluster at a location desirable for the emission surface, for example by clipping it with a pair of scissors. Naturally, it is also possible to first cut off the cluster and then fasten it to the conductive support. The individual carbon fibers, by way of example, may have diameters ranging between two and ten microns. Diameters between about five to eight microns are customary in the trade.

The field emission cathode of the invention can be used to good advantage in an electron impact ion source of a mass spectrometer or a molecular beam detector (see for example the publication by H. Pauly and J. P. Toennies in "Methods of Experimental Physics" Vol. 7A, pages 227-360, Academic Press, New York, 1968), because a field emission cathode generates very little radiation heat, and hence need not be shielded against the condensation surface of a cryogenic pump. Thus, the ion source may be surrounded by a condensation surface of a cryogenic pump, so that it is possible to generate in the ionization area extraordinarily low residual gas pressures for gases of low molecular weight, including hydrogen. The field emission cathode can be heated or baked out at high temperatures and no changes as to its properties are demonstrated even after an operating time of one thousand hours and more.

DESCRIPTION OF THE PREFERRED EMBODIMENTS

Figure 1:
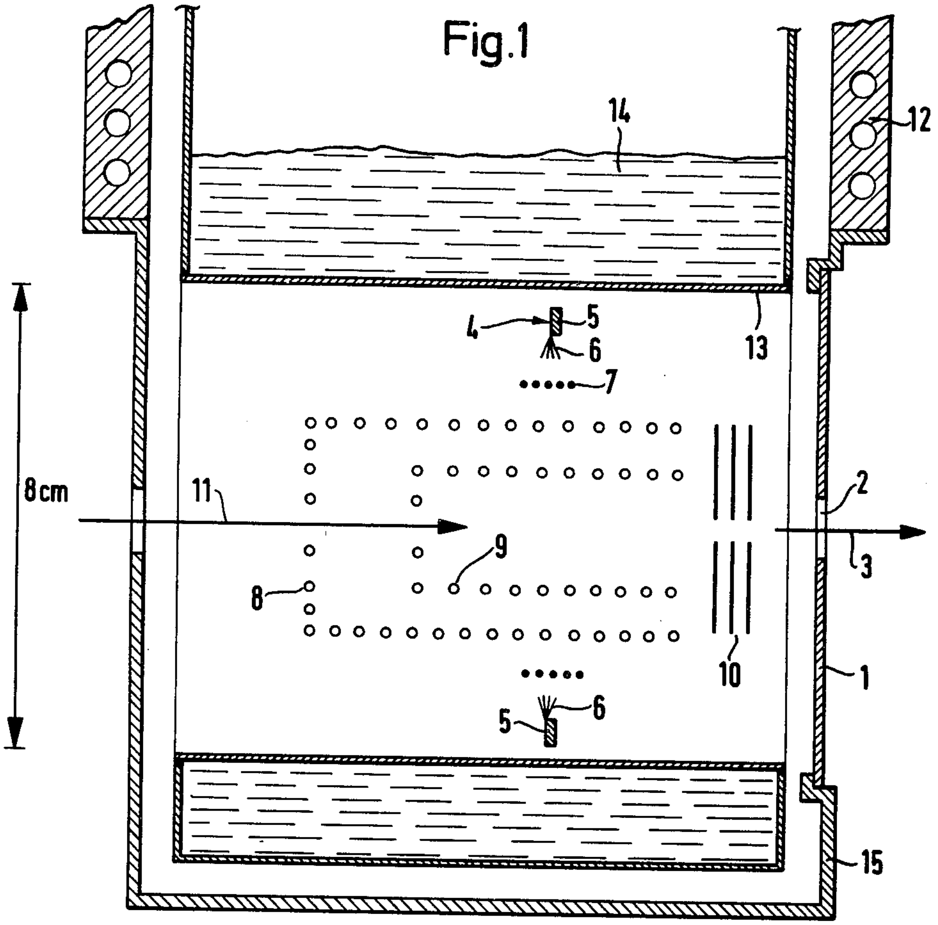
FIG. 1 shows an axial section of an electron impact ion source which contains a field emission cathode according to one embodiment of the invention.

The cold cathode or electron impact ion source shown in axial section in FIG. 1 comprises a conductive base plate 1, preferably of copper, on which the different electrodes of the ion source are mounted by insulating supports and/or insulated holding and lead-through wires (not shown) as is customary in the vacuum tube art.

The base plate 1 comprises a central aperture 2 for discharging a generated ion beam 3 into a mass spectrometer (not shown) located to the right of the base plate, for example a small electro-magnetic mass spectrometer of customary design with a magnetic sector field of 90° and a radius of 4 cm.

Figure 2:
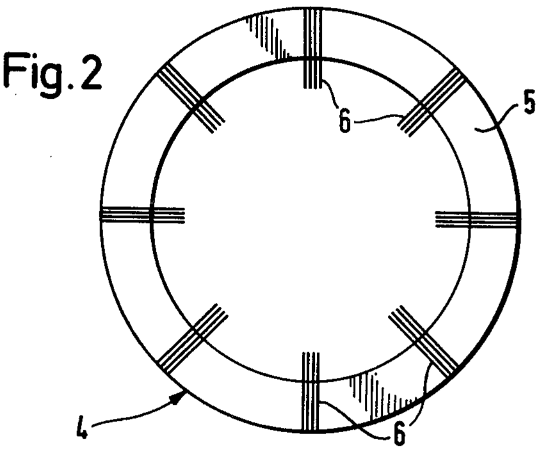
FIG. 2 is a plan view of the field emission cathode of the ion source of FIG. 1.

The ion source comprises a field emission cathode 4 shown more precisely in FIG. 2 and comprising a disk-shaped metal ring 5, on which eight carbon or graphite fiber clusters 6 are so arranged in symmetrical distribution that the points or tips of the fibers point radially inwardly.

The individual carbon fibers may have a diameter from five to eight microns; each cluster 6 may include several thousands of such fibers and may have a diameter of about one millimeter.

A cylindrical extraction grid 7, which is maintained in operation at a positive voltage of for example two to four kilovolts with regard to the field emission cathode 4, is located radially within the field emission cathode 4. A cylindrical retarding grid 8 is located within this extraction grid 7; the electrons emitted by the carbon fiber tips and which pass through the extraction grid 7 are slowed down in the retarding grid 8 to an energy of several hundred electron volts. An interior cage 9 represents the actual ionization area, in which the retarded electrons are captured and oscillate back and forth in a manner known from the prior art. Cage 9 is located within the retarding grid 8. A set of diaphragm-like electrodes 10 comprise an ion lens for extraction of the ions from the ionization area. Lens 10 is used to focus these ions to form the ion beam 3, and is located at the open end of the grids 8 and 9 on the right-hand side of FIG. 1.

As shown schematically in FIG. 1, the left-hand ends of the grids 8 and 9 may include a frontal wall with a central aperture for the ingress of a molecular beam 11 to be ionized. The interior cage 9 may be maintained substantially at ground potential.

The base plate 1, consisting of copper or some other highly heat-conductive material, is in thermal contact with an outer shield 12 which may be cooled with liquid nitrogen. The electrode system of the ion source also extends into a cylindrical tube 13 whose inside forms a condensation surface of a cryogenic pump and/or a cryostat and whose outside is connected to a coolant 14, for example liquid helium. The tube 13 and the other parts of the cryogenic pump are preferably formed of stainless steel and are welded to each other. The arrangement represented in FIG. 1, including the outer shield 12 and a conductive radiation shield 15, preferably of copper, are so dimensioned that they can be inserted into an ultra high vacuum chamber with a diameter of 150 mm which can be pumped by means of an ion getter and titanium sublimation pump.

The field emission cathode of FIG. 2 preferably is formed prior to the actual start of operation if the ion source is used for measuring purposes and the like. For this the pressure in the ion source is reduced to approximately $10^{-4}$mbar and a voltage of one or a few kilovots is applied between the field emission electrode 4 and the extraction grid 7. At these high voltages a bake out and/or tip forming effect takes place and the emission current drops from its initial value, within approximately thirty minutes, to a value lower by about ten to thirty percent, at which it then remains stable.

With the described field emission cathode it is possible to generate continuous emission currents from one to five milliamperes at extraction voltages from about two to five kilovolts. the emission current is stable at pressures below $10^{-6}$ mbar, within a range of about one to three percent. The field emission cathode of Fig. 2 with the carbon fiber clusters 6 has been operated at vacuums between $10^{-8}$ and $10^{-12}$ mbar. for more than one thousand hours without degradation of its properties.

With the field emission electron impact ion source according to FIG. 1 the background or residual gas spectrum can be reduced, in comparison with a corresponding ion source with thermally emitting cathodes, depending on the mass index, by one and up to more than two orders of magnitude.

The described embodiment can be modified, for example by arranging more or fewer carbon fiber clusters 6—perferably symmetrically—on the ring 5. The clusters also may be oblong, that is brush-like, in circumferential direction. Indeed, the entire ring 5 may be provided with a continuous inwardly projecting carbon fiber "brush".

The carbon fiber clusters 6 may be fastened on ring 5 by clamps, by wire, and/or with a conductive paste or adhesive.

Figure 3A:
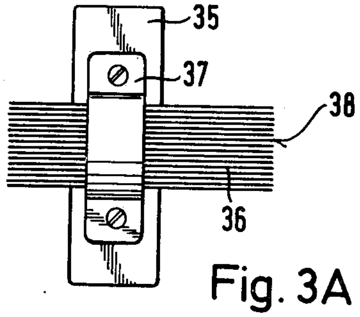
FIGS. 3A and 3B are plan and frontal views of a field emission cathode according to a second embodiment of the invention.
Figure 3B:
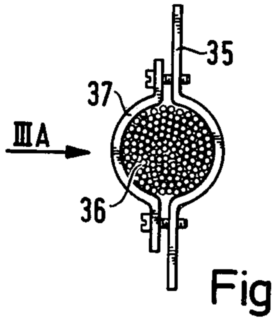

The field emission cathode represented in FIGS. 3A and 3B contains a single fiber cluster 36 consisting, for example, of carbon fibers with a thickness from five to eight microns, the cluster 36 being clamped firmly to a metal plate 35 by means of bracket 37. The frontal surface 38 of the carbon fiber cluster 36 may be substantially planar when viewed macroscopically and may be formed by simple cutting off the carbon fiber cluster 36. No special machining, such as shaping of the individual carbon fibers, is necessary. The carbon fibers may extend substantially parallel with each other or may diverge slightly in a cluster-like fashion (not shown).

Figure 4A:
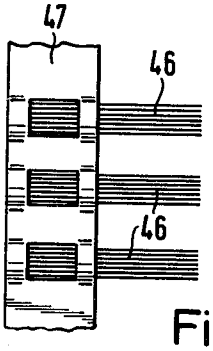
FIGS. 4A and 4B are plan and frontal views of a field emission cathode according to a third embodiment of the invention.
Figure 4B:
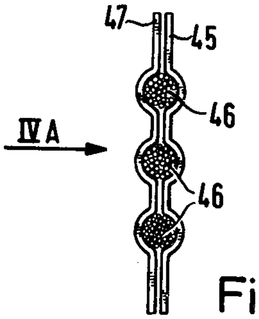

The field emission cathode of FIGS. 4A and 4B contains a plurality of carbon fiber clusters 46 arranged in spaced relation and parallel with each other and clamped between two metal brackets 45 and 47 respectively, which in each case are slightly bulged out. The frontal surfaces of the carbon fiber clusters 46 may all be located in a plane or may extend in alignment with an extraction electrode at different distances away from the holding clamps 45, 47.

Figure 5A:
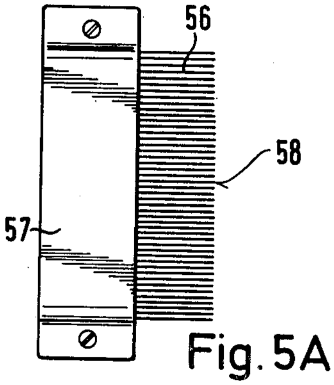
FIGS. 5A and 5B are plan and frontal views of a field emission cathode accroding to a fourth embodiment of the invention.
Figure 5B:
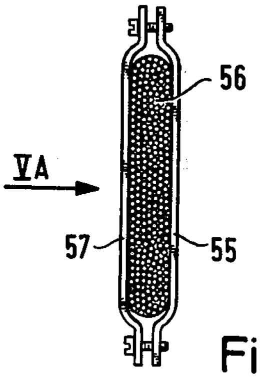

The field emission cathode of FIGS. 5A and 5B contains an oblong, brush-like carbon fiber cluster 56 clamped between two correspondingly shaped clamps 55,57. The frontal surface 58 may be planar or may be shaped in any desired fashion.

Naturally the carbon fiber clusters of the field emission cathodes according to FIGS. 3 to 5 also may be fastened in some other manner to the cathode support, for example by a conductive silver paste or the like.

We claim:

1. An electron impact ion source for use in a mass spectrometer, molecular beam detector, or like instrument comprising:

an inner ionization cage defining a generally cylindrical ionization chamber;

a retarding grid disposed in radially spaced encompassing relation to the ionization cage;

an extraction grid disposed in radially spaced encompassing relation to a predetermined portion of the retarding grid;

and a field emission cathode positioned in radially spaced encompassing relation to the extraction grid, the field emission cathode comprising a conductive support on which a multiplicity of carbon fibers are mounted, the carbon fibers projecting radially inwardly toward the extraction grid with the tips of the fibers affording a multiplicity of electron emission points directed toward the axis of the ion source.

2. An electron impact ion source according to claim 1 in which the carbon fibers have diameters in the approximate range of two to ten microns.

3. An electron impact ion source according to either claim 1 or claim 2, in which the carbon fibers are arrayed in a series of clusters, symmetrically spaced about the inner circumference of an annular support, each cluster including at least about one thousand fibers and having a diameter of the order of one millimeter.

* * * * *